United States Patent [19]

Lenglin et al.

[11] 4,017,134
[45] Apr. 12, 1977

[54] RACK-MOUNTING FOR ELECTRONIC EQUIPMENTS

[75] Inventors: Thierry Lenglin, Trebeurden; Albert Lissillour, Tregastel; Jean-Louis Desaunay, Perros-Guirec; Robert Le Corvec, Vanves; Robert Simonneau, Perros-Guirec; Richard Rouquaud, Grigny, all of France

[73] Assignees: L'Etat Francais, represente par le Ministre des Postes et Telecommunications; Socotel Societe Mixte pour Developpement de la Technique de la Commutation dans le Domaine des Telecommunications, both of Issy-les-Moulineaux, France

[22] Filed: July 8, 1975

[21] Appl. No.: 593,967

[30] Foreign Application Priority Data

July 8, 1974 France .................... 74.24253

[52] U.S. Cl. .................... 312/351; 312/257 SK; 361/390
[51] Int. Cl.² .................... H02B 1/04; H05K 7/16
[58] Field of Search ...... 312/194, 195, 223, 257 R, 312/257 SK, 263, 320, 350, 351, 234.2; 317/97, 101 DH

[56] References Cited

UNITED STATES PATENTS

| 3,178,246 | 4/1965 | Riles | 312/257 SK |
|---|---|---|---|
| 3,439,466 | 4/1969 | Schreyer | 312/257 R |
| 3,565,502 | 2/1971 | Bracy et al. | 312/257 |
| 3,728,662 | 3/1973 | Puri | 312/320 |
| 3,948,581 | 4/1976 | Helman et al. | 312/257 R |

*Primary Examiner*—Casmir A. Nunberg
*Attorney, Agent, or Firm*—Laff, Whitesel & Rockman

[57] ABSTRACT

A chassis for electronic equipment comprises a frame structure including two similar spaced uprights connected respectively at their tops and at their bottoms by two similar rigid frames and at least one cell for the reception of circuit boards, said cell comprising a floor and a ceiling between which the boards can be held, said floor and ceilings being slidably supported on brackets releasably fixed in upright grooves in said upright.

4 Claims, 10 Drawing Figures

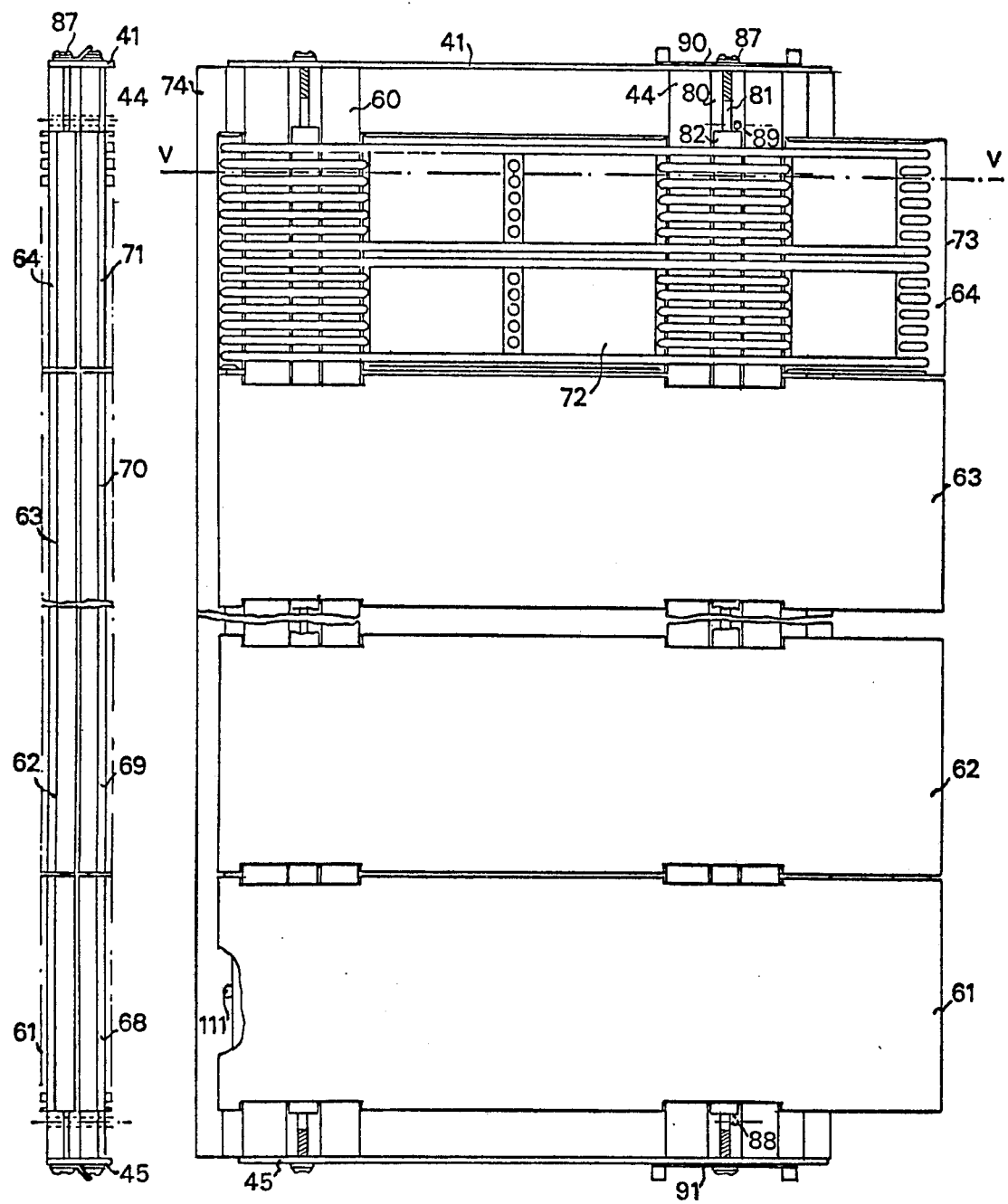

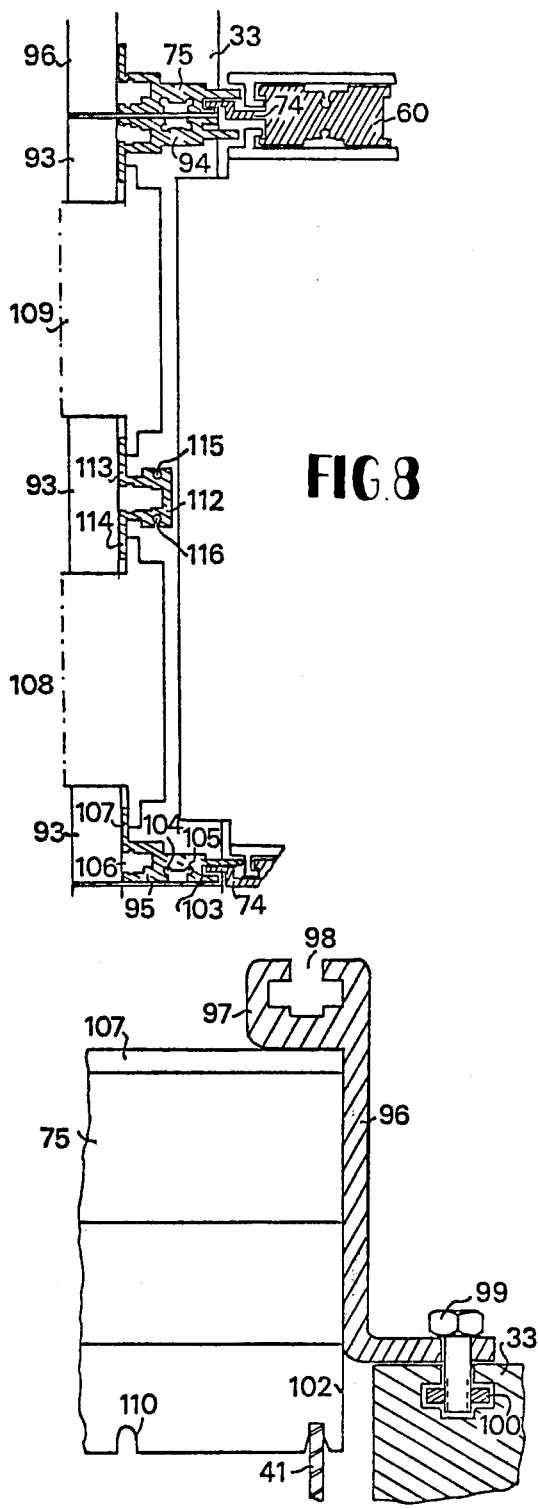
FIG. 8
FIG. 9
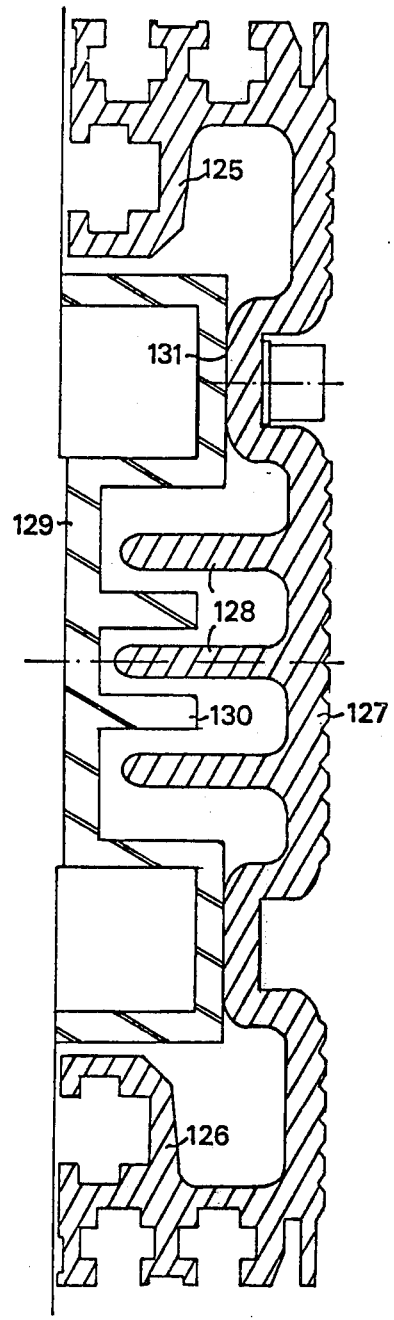
FIG. 10

RACK-MOUNTING FOR ELECTRONIC EQUIPMENTS

The present invention concerns a frame or chassis for electronic fittings and more particularly a chassis for permitting the mounting of several stages of circuit boards, which may be of the plug in type, as utilized in the technology of telecommunications.

Currently, in all branches of the technology of telecommunications, chassis have already been used which permit the mounting in staggered cells of circuit boards carrying electrical or electronic components. The boards are either in the form of boards of different widths or more frequently are simple printed board circuits or are themselves carriers for boards. At the bottom of the cells are connectors into which the board can be plugged.

The main requirements of a chassis are the following. It must be based on modules in horizontal and vertical directions. The constituent elements of the chassis must be capable of being easily erected or dismantled to facilitate stocking, transport and handling. The number of different parts must be as few as possible. The electronic components held by the chassis must be capable of being effeciently ventilated.

In addition, in these chassis attention must be paid to the load carrying capacity of the supports for the boards as the loading on the chassis may reach several tons of kilos per module. Thus, on the one hand, correct energization of the boards in the connectors in desirable and on the other hand it is desireable to present the boards leaving the supporting floor. Finally, it is likewise desireable to keep a correct location of the boards even although there are vertical tolerances on the relative positions of the supporting floors of the chassis.

By way of illustration of the state of the technology concerning such chassis reference is made to French Pat. Nos. 206062 X, 2111034 and 2111035, none of which have all the qualities indicated above. One may also cite as forming part of the state of the technology. British Pat. No. 1141661, French Pat. No. 1586408 and U.S. Pat. No. 3723822.

One object of the present invention is to provide a chassis which may have practically all these qualities and which in addition may be used with other chassis in telecommunication centres.

According to one aspect of the present invention, a chassis for electronic equipment comprising a frame structure includes two similar spaced uprights connected respectively at their tops and at their bottoms by two similar rigid frames and at least one cell for the reception of circuit boards. The cell comprises a floor and a ceiling between which the boards can be held. The floor and ceiling are slidably supported on brackets releasably fixed in upright grooves in said upright.

According to another aspect, a chassis for electromic equipment comprises a frame structure including two similar spaced uprights connected respectively at their tops and at their bottoms by two similar rigid frames frame. Each comprises two lateral plate means fixed respectively to the uprights and connected by crosspiece means. Each upright is constituted by a symmetrical, profiled section defining two posts connected by a rigid web. Each post has vertical grooves defining a T shape for receiving brackets each comprising a part adapted to locate in the groove. The part has a cylindrical portion, a small plate of generally rectangular shape, and a nipple projection at opposite side of the plate from the cylindrical portion. The plate has two diagonally opposite corners having a thickness which diminishes progressively towards the edge of the corner.

The length of the small plate is equal to the overall length of the arms of the T Shaped groove so that when the small plate is introduced into the groove and is turned by 90° the bracket is retained therein. The bottom of the groove has holes defined therein, each hole being capable of receiving the nipple or projections provided of the bracket. The brackets are intended to support a cell structure serving as a recepticle for printed circuits boards.

Preferably, the bottom of the grooves of the posts are recessed and receive in the recess a slide having said holes in which the nipples of the small plates of the brackets can be received.

Preferably, the chassis includes at least one cell structure held by the frame structure. Each cell structure comprises a floor and a ceiling both formed by grooved plates placed side by side. The floor resting in lower beams extends between the uprights. The ceiling is suspended from upper beams extending between the uprights, the lower and upper beams have their ends respectively fixed to lateral rigid bars each rigid bar serving as a slide and being supported slidably by two of the brackets which are respectively fixed in said grooves of the upright adjacent to the slide bar.

In another preferred arrangement, the chassis includes connectors for receiving the circuit board connector frames. The connectors are mounted each connector frame which is constituted by two connector frame uprights of identical profiled frames and at least two frame crossbars. Each connector frame upright is fixed to the rear post of an upright by means of a fixing device mounted in a groove of this post facing the connector frame. The connector frame is connected to the frame structure uprights by their ends. Each connector frame is associated with a cell so that the lower connector frame crossbars rests on the adjacent lower beam of the associated cell. The connector frame cross bars have identically profiled sections and a relatively wide vertical edge for the conventional fixing thereto of the connectors. The frame crossbars are mounted so that the wide edge of adjacent crossbars extend towards one another.

Other features of the present invention will appear more clearly in reading the following description of one embodiment the said description being made in conjunction with the attached drawings, in which:

FIG. 5 is a view in section of a floor-ceiling assembly of a cell.

FIG. 6 is a view from above of the assembly of FIG. 5;

FIG. 7 is a front view of the assembly of FIG. 5;

FIG. 8 is a view in vertical section of a connector frame;

FIG. 9 is a view of the fixing means of a connector frame on an upright post; and FIG. 10 is a view in section of an alternative form of frame upright.

Figure 1:
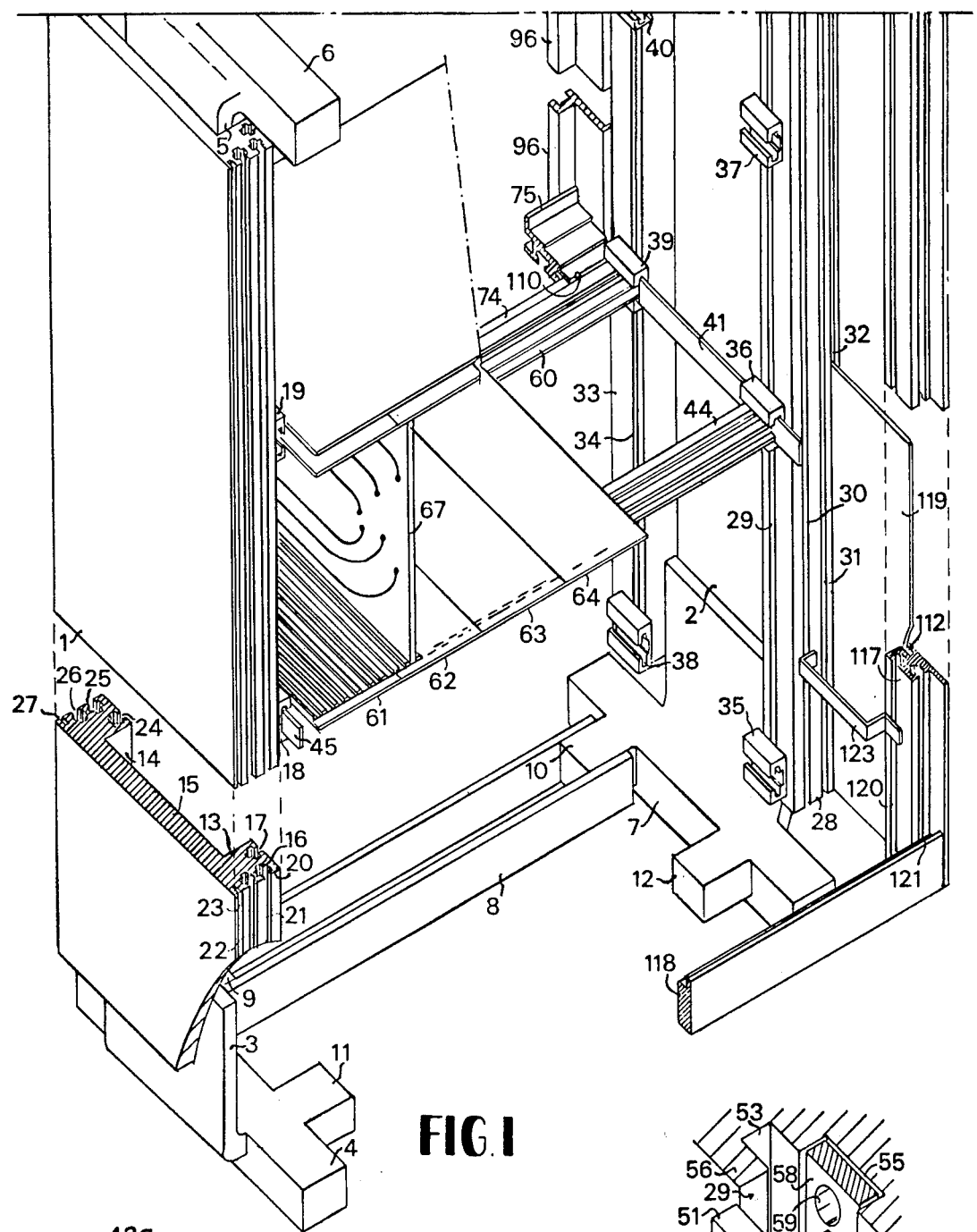
FIG. 1 is a view in perspective, with parts cut away, of a chassis according to the invention.

The chassis of FIG. 1 comprises two uprights 1 and 2. The upright 1 is fixed at its bottom to the wide foot plate 3 of a base plate 4 and at its top part to the wide foot plate 5 of a top plate 6, which is identical and symmetrical to the base plate 4. Likewise, the upright 2 is fixed at its bottom to the base plate 7 and at its top to an identical top plate not shown. The plates 4, 6 and 7 are identical and symmetrical about middle vertical planes. The plates 4 and 7 are connected by crosspieces constituted by U-Shaped angle irons or sections 8 which are fixed by conventional means to short arms such as 9 and 10 of the plates 4 and 7, respectively. The short arms 11 and 12 are likewise connected by a section similar to section 8. The top plates 6 are connected in the same manner.

The upright 1 has a profiled section defining two vertical posts 13 and 14 connected by a relatively thick web 15. Upright 1 has been represented with a part cut away so as to show its section in detail. The upright 1 is symmetrical with respect to its vertical medial plane. The post 13 has a substantially parallelepiped cross-section. The faces 16 of post 13 facing the inside of the chassis with a cross shaped section groove 17 in which are shown brackets 18 and 19 which serve to support the chassis cells. The face 20 of post 13 which faces the front of the chassis has two grooves 21 and 22, also cross shaped in section and a slot 23 the functions of which will be explained hereinafter. The post 14, being symmetrical with the post 13, has corresponding grooves 24, 25, 26 and a slot 27.

The upright 2 is identical with the upright 1 but is symmetrical relative thereto. The post 28 of upright 2 has grooves 29, 30 and 31 corresponding respectively to 17, 21 and 22 and a slot 32 corresponding to slit 23. The post 33 of upright 2 has similar elements, of which only the slot 34 corresponding slot 17 is seen in FIG. 1. In the groove 29 are mounted brackets 35, 36 and 37 and in the groove 34 are mounted brackets 38, 39 and 40. Each pair of brackets, such as 35 and 38, mounted at the same height define the position of the top of one cell and the bottom of another cell of the chassis. Only the pair, 36 and 39 is shown completely equipped.

Figures 2, 3:
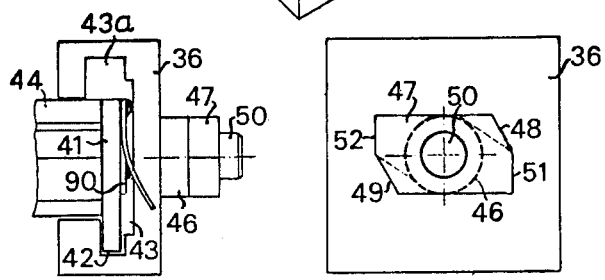
FIG. 2 is an end view of a slide bar mounted in a bracket in the form of a runner.
FIG. 3 is a view of the rear of the bracket of FIG. 2.

The bracket 36, which is identical with the other brackets 18, 19, 35, 37, 38, 39 and 40, is shown on a larger scale in side view, in FIG. 2 and in rear view in FIG. 3. Bracket 36 comprises, at the front, a front part which is of C shaped section and which serves as a block for a receiving slide bar 41. The width of the lower groove 42 of this C shape is almost equal to the thickness of the slide 41 but is slightly larger to provide the necessary clearance. The width of the upper groove 43a is greater than that groove 42. The bottom of the C section of bracket 36 defines a recess part 43 which permits free passage for the heads of the screws connecting the slide bar 41 to a beam 44 which will be discussed in detail hereinafter.

As FIG. 2 clearly shows, the upper groove 43a plays no part in the positioning of the slide bar 41. It is to be noted that the bracket 18 opposed bracket 36 is of an opposite contour, that is to say, the wide groove of bracket 18 is at the bottom and guides the slide bar 45, the front end of which is seen in FIG. 1, while the narrow groove is at the top. In this arrangement, the groove of bracket 36 is used as a horizontal position reference for the beam 44 and the elements it carries, the upright 2 of the chassis. By locating the wider groove of 18 at the bottom of the bracket this enables the tolerances allowed on the length of the beam 45 or similar beams to be taken into account.

The rear part of the bracket 36 comprises, in a direction away from the rear of the sectioned C part, a cylindrical portion 46, a plate 47 of generally rectangular shape of which two diametrically opposite corners 48 and 49 are cut away so that the thickness diminishes progressively to the edge, and a cylindrical nipple 50. The width of the plate 47 is equal to the diameter of portion 46 and its length between the faces 51 and 52 is almost equal to the maximum width of the groove 29.

Before describing in relation to FIG. 4, how the bracket is introduced into the groove 29, this groove will be described more completely. The groove 29, which is identical with the grooves 17, 24 and 34, is similar to the grooves 21, 22, 25, 26 and 37 and comprises two lateral grooves 53 and 54, a rear groove 55 and an opening slot between two lips 56 and 57. In the rear groove 55, and also in grooves 17, 24 and 34 there is a slide 58 which has holes such as 59 regularly spaced at a predetermined pitch throughout its length. The thickness of slide 58 is slightly less than the depth of the groove 55 and its width is substantially equal to width of groove 55. Its length is dictated by the height of the chassis. The width of each of the grooves 53 and 54 is substantially equal to the thickness of plate 47. The thickness of each of the lips 56 and 57 is substantially equal to the axial length of portion 46 and the width of the slot defined by lips 56 and 57 is substantially equal to the diameter of portion 46.

Figure 4:
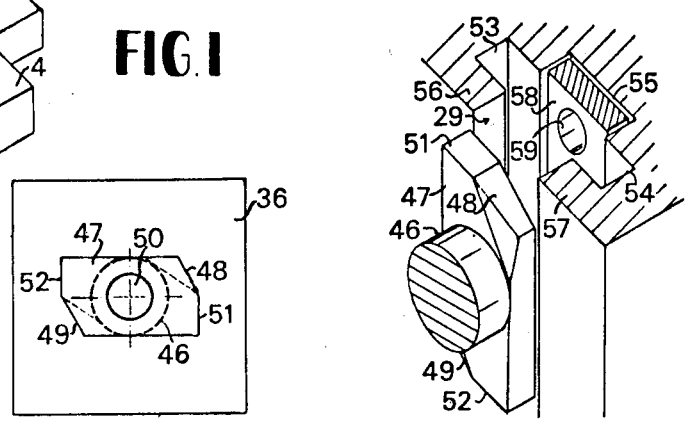
FIG. 4 is a view in perspective of a detail for explaining the mounting of a bracket on a groove of an upright post.

To introduce bracket 36 into groove 29, the plate 47 is presented in the manner as shown in FIG. 4 opposite a hole such as 59 and then bracket 36 is moved into groove 29 between lips 56 and 57 so that the nipple 50 penetrates hole 59. Next the bracket 36 is turned by a quarter of a turn, or 90°, so that the faces 51 and 52 are supported on the respective bottoms of the grooves 54 and 53. It is obvious that the cut corners 48 and 49 facilitate the rotation and locking of plate 47 in groove 29. At the end of this rotation, the elasticity of the metal of the small plate 47 permits the deformation of plate 47 and enables the faces 51 and 52 to reach and lie flat against the bottom of the grooves 53 and 54 to remove bracket 36, or any of the other brackets, if the above procedure is reversed. When the slide 41 is slid into brackets 36 and 39, it is not possible to remove either bracket 36 or 39 from the post in which it is connected.

It should be noted that the use of brackets, such as 36, and of grooves such as 29 equipped with a slide 58, on the one hand, avoids the use of screws and of nuts liable to loosen and, on the other hand, the piercing of holes in the posts of the risers which can be rough-manufactured. Finally, the piercing of holes in the slide 58 is easier to carry out than in the risers and offers a greater precision in the positions of the axes of these holes. It is further to be noted that the slides, such as 58, are positioned in height, once and for all, and each is fixed by a screw at the bottom of the rear channel of the corresponding groove.

FIG. 1 shows, further, that between the slides 41 and 45 there are mounted two transverse beams 44 and 60 which support juxtaposed grooved plates 61, 62, 63, 64, etc., which form the floor of a cell the ceiling of which is formed by identical grooved plates, but turned downward 65, 66, etc., hooked on posts, not visible, similar to 44 and 60 mounted on slides supported by brackets 37 and 40, on one side and 19 and a bracket not shown, on the other side, the slides not being shown. Above the plates 65, 66 etc., there are located the floor plates of another cell these plates being supported by the beams by which plates 65, 66 etc., are suspended. By way of example, there is shown between corresponding grooves of plates 62 and 66 an insertable board 67.

FIGS. 5 to 7 show more in detail the relative positions of the slide bars transverse beams and plates of the floors and the cielings of the cell.

FIG. 5 is a view in section taken on the line V—V of FIG. 6. Assuming that the floor-ceiling assembly shown is the complete assembly supported by the brackets 36, 39, 18 etc. FIGS. 5 to 7 show the slide bars 41 and 45, the beams 44 and 60 and grooved plates 61,---, 64 serving as the floor of an upper cell and grooved plates 68,---, 71 serving as the ceiling of a lower cell. Only the grooves of plate 64 have been shown in the interests of clarity. The grooved plates are preferably moulded in plastic material. Each plate, such as 64, comprises 15 grooves of which, by example only, the pitch is 5.08mm and the width is 1.83mm. The grooves are interrupted several times by openings 72 facilitating the ventilation of the boards 2. The front end 73 of each plate may be provided with a label holder, not shown, possibly integrally with the plate.

The beams 44 and 60 are of identical profiled section and therefore only one beam will be described in detail. In section, the beam 60 is practically symmetrical about a vertical medial plane except for the projecting platform 74 which engages a lower traverse 75 of the connector supporting frame as FIG. 1 shows, the corresponding projection of beam 44 having no special function. It suffices therefore to describe only one of the two vertical faces of the beam 60. Each vertical face, apart from platform 74, comprises an upper projecting edge 76 about which is fitted a slide bar 77 of plate 64. Likewise, there is a symmetrical slide fitting on the edge symmetrical to edge 76. There is a lower projecting edge 78 about which is fitted a slide bar 79 of plate 71 and again a symmetrical slide bar engages the edge symmetrical to edge 78. The thickness of edges 76 is substantially equal to the distance between the lower edge of bar 77 and the underside of the plate 64; that is to say, the clearance between plate 64 and beams 60 and 44 is small. The thickness of edge 78 is less than that of edge 76 so that plate 71 is relatively more displaceable with regard to beams 44 and 60 and can be so displaced depending upon the height of the inserted boards 67 provided they are within the limits of admitted tolerances.

In FIG. 5 plate 71 is shown in the highest position it can occupy. It should be noted that the weight of the cell located below beams 60 and 44, including any boards which are inserted therein, is not supported by beams 60 and 44, but only by the floor underneath having its own beams. The edges 78 simply holds the plates 68 to 71, from above, only when the lower cell is empty.

The upper face of beam 44 has a shallow flat groove 80 at the centre of which there is a deeper groove 81, both grooves 80 and 81 extending longitudinal of the beam. In the groove 80 is located a bar 82 having regularly spaced holes. A projection 83 of plate 64 is engaged in one of these holes for determining the position of the plate 64 relative to the beams 44 and 60 which latter has similar elements. The lower face of beam 44 has likewise a shallow flat groove 84 at the centre of which is located a deeper groove 85, the grooves 84 also extending longitudinally of the beam 44. In the groove 84, there is lodged a leaf spring 86 which is convex downwardly and which is for ensuring the application of sufficient pressure on the plates 68 to 71 to maintain correct penetration of the boards 67 into these plates 68 to 71.

The grooves 81 and 85 serve for fixing the slidebars 41 and 45 to the beams 44 and 60 in that a self cutting screws such as 87, often passing through holes in bars 45 and 41 are self tapped into the ends of grooves 81 and 83. As FIG. 6 shows, the bar 82 is prevented from moving lengthwise in the groove 80 by buffers 88 and 89 located in holes in beam 44.

In constructing a floor-ceiling assembly such as that shown in FIGS. 5,6 and 7, two beams 44 and 60 are cut to length and fixed, to the slide 41 by screws 87. In the grooves 80 of beam 44 and 60, bars 82 are lodged and then there is fitted on the corner edges 76, the grooved plates 61 - 64. Vertical blind holes are made in beam 44 and buffers 88 and 89 are located therein to position correctly the bar 82 of relative to beam 44. The assembly is inverted and the leaf springs 86 are positioned in the grooves 84 and then the lower plates 68 - 71, are fitted on the corners 78. Finally, the slide 45 is fixed to beams 44 and 60 by screws 87. The assembly may then be slid into four brackets such as 36, 38, 18 and a fourth mounted as indicated above.

The depth position of this assembly on the brackets is determined by stop pieces 90 and 91. The piece 90 is shown in FIG. 2 and it is composed of a short blade of spring steel cut so as to define a central part by which it is fixed, by screws, to the slide bar 41 and two tongues 92 curved outwards from the floor-ceiling assembly. The distance between the two tongues 92 is substantially equal to the width of a bracket such as 36. Thus, when the assembly is slid into the four brackets, care is taken in the passage of beam 44 into brackets 18 and 36, to deflect the first tongue 92 to meet the bracket and after this deflected tongue has passed the bracket, it is released to take up its initial undeflected position, trapping the bracket between the tongues. The assembly is then completely positioned. By using these fixing pieces a rapid assembling and diamantling of the chassis is possible.

It is to be noted that the slide bar 41 extends further rearwards than the slide bar 45. This is to facilitate correct positioning of the connector supporting frame as will now be explained with reference to FIGS. 8 and 9.

FIGS. 8 shows, in section, a connector supporting frame and more particularly a frame upright 93 the other frame upright obviously not being visible as the rear is in section, an upper traverse 94 and a lower traverse 95. Also shown are the lower end of any upper connector frame of the next upper cell which includes traverse 75 mounted above the shown frame to show in detail the adjacent parts of two frames and their relative positions in relation to the common associated elements such as the beam 60. The elements 75 and 96 are visible in FIG. 1 but the elements 93 to 95 have not been shown in FIG. 1. All the frame uprights are of identical sectional profile and are cut to the desired length likewise the upper or lower cross bars 94 and 95 are of identical cross sectional profile.

The upright 96 is shown to a larger scale and in section in FIG. 9. It is generally L-shaped in section the extreme edge of one leg of this L being enlarged as at 97 so as to define a strut having a cross shaped groove 98 for receiving vertical feed cables or bars, in accordance with established conventional practice in telecommunication equipment. The other leg of the L, the smaller leg, has holes or notches through which pass screws or bolts such as 99 and these are screwed into the tapped holes of a slide 100 slidably located in cross-shaped groove 101 of the post 33 of the upright 2, the groove 101 being symmetrical in shape and position with the groove 30 (FIG. 1). The slide 100 is slid into the groove 101 as shown and not in the bottom recess. Compare the positioning of slide 58 in FIG. 4. The holes or notches for passage of the screws 99 are bored or punched. The length of the small leg of the L is such that the end 102 of the crossbar 75 does not touch the post 33 but is sufficiently close to enable the rear end of the slide bar 41 to lodge in a notch formed in crossbar 75. Thus, even if the connector supporting frame is dismantled and then re-assembled the notch and the end of 41 ensures the correct relative positioning of the frame in relation to the floor and in relation to the ceiling of the cell.

Each crossbar such as 75 or 95 is a lower cross bar which has at the front edge a groove 103 in which the platform 74 of the corresponding beam engages the mounting of the crossbar the engagement being such that the upper part of groove 103 rests on 74. In addition, each lower and upper crossbar has two grooves 104 and 105 serving to enable the crossbar to be fixed to the associated frame uprights by means of self tapping screws which are screwed into grooves 104 and 105 and through holes provided in the large leg of the L of upright 90. Finally, in the rear face each, crossbar has another groove 106 adapted to receive feed cables or bars. A vertical wing 107 completes the crossbar and is adapted to support the board connectors such as 108 and 109 which are fixed thereto by conventional means. The upper parts of the grooves 103 of the crossbars 75 and 95 and the lower parts of the groove 103 of crossbar 94 have notches which engage nipples that are integral with the part 77 of the corresponding grooved plate. Such a nipple 111 is shown at the cut away part of the plate 61 in FIG. 6. The notches 110 are punched or cut out and serve to position each individual plate relative to the connector frame.

It should be noted that, in FIG. 8, the connector supporting frame is shown as including an intermediate crossbar 112 mounted between crossbars 94 and 95. The crossbar 112 is of a section which is symmetrical about a horizontal medial plane. The section has a somewhat Omega-shape in that it has two branches 113 and 114 forming vertical wings similar to wings 107 of crossbars 94 and 95, on which are mounted the corresponding parts of the connectors 108 and 109. The body of crossbar 112 has open grooves 115 and 116 for fixing crossbar 112 to the uprights 93, by means of self tapping screws. The inside of the Omega forms a groove adapted to receive feed cables and bars. It is to be noted that the crossbar 112 may be omitted if the height of the corresponding cell so dictates. For example, this may arise when a connector longer than 108 or 109 is mounted directly between crossbars 94 and 95. It is also to be noted that a connector supporting frame, such as that which has just been described, may be utilized independently of the frame according to the invention, but it finds its main usefulness associated with the latter.

As regards the mounting of the connector supporting frame on the frame structure, it should be understood that this mounting is only affected once the positions of the floors and ceilings of the cell have been determined and the slides and the corresponding beams have been mounted on the posts. In particular, the passage holes for the screws 99 and the notches 110 and the notches which receive slide bar 41 are formed or cut in the course of this mounting. In addition, the frame forms a completely collapsible element and the lugs of the connectors provide an automatic cabling form of the type, with connection winding.

FIG. 1 also shows part of a covering or cladding of the frame structure, such cladding being composed mainly of four uprights such as 117 shown at the four corners of four straps, such as 118 mounted at the tops and at the bottoms of four panels such as 119. The cladding may also include conventional hoods (not shown) hooked on to the uprights 117. The upright 117 is a profiled section made of extruded aluminium alloy which has two cross shaped grooves 120 and 121 and a third groove 122. The groove 120 fixes links such as 123, one end of which is connected to upright 2 in the groove 30 and the other to upright 117 in the groove 120. The connection between link 123 and the grooves is connected in the frames by means similar to the screw 99 and the tongue 100. Different shapes would enable connecting groove 31 and groove 120. The groove 121 serves as a means for fixing hooks which serve as hooking means for the hoods. The straps 118 are fixed at the end of the wings 124 of the uprights 117, the fixing being capable of reinforced by a connection between straps 118 and the plates such as 7. Straps 118 may also have open grooves permitting the use of self tapping screws passing through wings 124 and self tapped into said grooves. FIG. 10 shows a more elaborate form of upright than the uprights 1 and 2 already described. Two posts 125 and 126 are still provided by those are hollow and each has three cross shaped grooves. A web 127 is thinner than web 15, but it has reinforcing ribs 128 connects the posts 125 and 126. FIG. 10 also shows how a plate equivalent to plate 3, and the web are connected along plane surfaces 131. It is also to be noted that the plate 129 may be moved away sufficiently vertically with regard to the plate 4 in order that the upright 1 or 2 may be positioned lower than is indicated in FIG. 1. Referring again to FIG. 1 the rear grooves of the posts 14 and 33 serve to connect upright such as 117 to the uprights 1 and 2 as well as supporting other elements of the cable tracks.

Although the principles of the present invention have been described above in relation to one particular embodiment, it must be understood that the said description has only been made by way of example and does not limit the scope of the invention.

We claim:

1. A chassis for electronic equipment comprising a frame structure including two similar spaced uprights connected respectively at their tops and at their bottoms by two similar rigid frames, each frame comprising two lateral plate means fixed respectively to the uprights and connected by crosspiece means, and wherein each upright is constituted by a symmetrical, profiled section defining two spaced, parallel posts connected by a rigid web, each of said posts having vertical grooves defining a T-shape cross section for receiving brackets, a plurality of brackets, each comprising an elongated part adapted to be located in the groove and then rotated through a small angle to a locked position, said elongated part having a cylindrical portion on one side, said elongated part further comprising a small plate of generally rectangular shape, and a nipple projecting from a side of the plate opposite the cylindrical portion, said plate having diagonally opposite corners with a thickness which diminishes progressively towards the edge of the corner, the length of the small plate being substantially equal to the overall length of the arms of the T-shaped groove, so that when the small plate is introduced into the groove and is turned by 90°, the bracket is retained therein, and the bottom of the groove having holes defined therein, each hole being shaped and proportioned to receive said nipple.

2. A chassis according to claim 1, wherein the bottoms of said T-shape grooves are recessed and slide means fitting into said recess, said slide means having said holes in which said nipples can be received.

3. A chassis according to claim 1 including at least one cell structure held by the frame structure, the cell structure comprising a floor and a ceiling both formed by grooved plates placed side by side, the floor resting on lower beams extending between the uprights and the ceiling being suspended from upper beams extending between the uprights, the lower and upper beams having their ends respectively fixed to lateral rigid bars, each rigid bar serving as a slide and being supported slidably by two of said brackets which are respectively fixed in said grooves of the upright adjacent to the slide bar.

4. A chassis according to claim 1, including connectors for receiving the circuit board, connector frames on which said connectors are mounted, each connector frame comprising two identically profiled connector frame uprights and at least two crossbar frames, each connector frame upright being fixed to the rear post of an upright by means of a fixing device mounted in a groove of said post facing the connector frame, the connector frame crossbars being connected to the frame structure uprights by their ends, each connector frame being associated with a cell so that the lower connector frame crossbar rests on the adjacent lower beam of the associated cell, the connector frame crossbars being identical profiled sections and having relatively wide vertical edges for fixing connectors thereto, the frame crossbars being mounted so that the said wide edges of adjacent crossbars extend toward one another.

* * * * *

UNITED STATES PATENT AND TRADEMARK OFFICE
CERTIFICATE OF CORRECTION

PATENT NO. : 4017134
DATED : 4/12/77
INVENTOR(S) : Thierry Lenglin et al.

It is certified that error appears in the above-identified patent and that said Letters Patent are hereby corrected as shown below:

Column 1, line 26, "effeciently" s/b --efficiently--

Column 1, line 31, second "in" s/b --is--

Column 1, line 32, "desireable" s/b --desirable--

Column 1, line 34, "desireable" s/b --desirable--

Column 1, line 54, "receiption" s/b --reception--

Column 1, line 58, "electromic" s/b --electronic--

Column 1, line 61, s/b a period --.-- after "frames"

Column 1, line 62, delete "frame." at beginning of line and insert --frame-- between "each" and "comprises"

Column 2, line 14, "recepticle" s/b --receptacle--

Column 5, line 60, "holds" s/b --hold--

UNITED STATES PATENT AND TRADEMARK OFFICE
CERTIFICATE OF CORRECTION

PATENT NO. : 4017134
DATED : 4/12/77
INVENTOR(S) : Thierry Lenglin, et al.

It is certified that error appears in the above-identified patent and that said Letters Patent are hereby corrected as shown below:

Column 6, line 12, "a" s/b deleted

Column 6, line 30, "38" s/b --39--

Column 6, line 47, "diamantling" s/b --dismantling--

Signed and Sealed this

Twenty-fifth Day of October 1977

[SEAL]

Attest:

RUTH C. MASON
*Attesting Officer*

LUTRELLE F. PARKER
*Acting Commissioner of Patents and Trademarks*